United States Patent
Kim

(10) Patent No.: US 12,494,397 B2
(45) Date of Patent: Dec. 9, 2025

(54) SEMICONDUCTOR DEVICE AND METHOD FOR FABRICATING THE SAME

(71) Applicant: SK hynix Inc., Gyeonggi-do (KR)

(72) Inventor: Jun Sik Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 648 days.

(21) Appl. No.: 17/863,932

(22) Filed: Jul. 13, 2022

(65) Prior Publication Data

US 2023/0253242 A1    Aug. 10, 2023

(30) Foreign Application Priority Data

Feb. 4, 2022   (KR) .................... 10-2022-0014881

(51) Int. Cl.
| | | |
|---|---|---|
| H01L 21/764 | (2006.01) | |
| G11C 8/14 | (2006.01) | |
| G11C 11/4097 | (2006.01) | |
| H01L 21/768 | (2006.01) | |
| H10B 12/00 | (2023.01) | |

(52) U.S. Cl.
CPC ...... *H01L 21/764* (2013.01); *H01L 21/76834* (2013.01); *H10B 12/482* (2023.02); *H10B 12/488* (2023.02)

(58) Field of Classification Search
CPC . H01L 21/764; H01L 21/76834; H10B 12/03; H10B 12/05; H10B 12/482; H10B 12/485; H10B 12/488; H10B 12/30; G11C 11/4097; G11C 8/14
See application file for complete search history.

(56) References Cited

U.S. PATENT DOCUMENTS

| | | | | |
|---|---|---|---|---|
| 2015/0129878 | A1* | 5/2015 | Shin | H10B 41/20 |
| | | | | 257/329 |
| 2017/0221813 | A1* | 8/2017 | Kim | H01L 23/5226 |
| 2020/0043941 | A1 | 2/2020 | Kim et al. | |
| 2022/0013524 | A1 | 1/2022 | Ryu et al. | |
| 2022/0037461 | A1* | 2/2022 | Cho | H10B 12/34 |
| 2022/0157822 | A1* | 5/2022 | Ahn | H10B 12/315 |
| 2022/0173107 | A1* | 6/2022 | Moon | H10B 12/34 |
| 2022/0352173 | A1* | 11/2022 | Lee | H10B 12/315 |
| 2023/0164976 | A1* | 5/2023 | Park | H10B 12/34 |
| | | | | 257/30 |

FOREIGN PATENT DOCUMENTS

| | | |
|---|---|---|
| KR | 10-2021-0077098 A | 6/2021 |
| KR | 10-2022-0005866 A | 1/2022 |

OTHER PUBLICATIONS

Office Action for Korean Patent Application No. 10-2022-0014881 issued by the Korean Patent Office on Aug. 11, 2025.

* cited by examiner

*Primary Examiner* — Mohsen Ahmadi
(74) *Attorney, Agent, or Firm* — IP & T GROUP LLP

(57) ABSTRACT

A semiconductor device comprises a lower structure; a plurality of semiconductor layers laterally oriented in a direction parallel to a surface of the lower structure; a plurality of bit lines connected an end of the semiconductor layers and extending in a direction perpendicular to the surface of the lower structure; word lines extending laterally in a direction crossing the semiconductor layers over the semiconductor layers; and a device isolation layer extending in the direction parallel to the surface of the lower structure to be disposed between the bit lines and the word lines and including air gaps.

7 Claims, 18 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2022-0014881, filed on Feb. 4, 2022, which is incorporated herein by reference in its entirety.

BACKGROUND

1. Field

The present invention relates to a semiconductor device, and more particularly, to a semiconductor device having a three-dimensional structure and a method for fabricating the same.

2. Description of the Related Art

In order to increase the net die of a memory device, the size of a memory cell is continuously reduced. As the size of the memory cell is miniaturized, it is necessary to reduce the parasitic capacitance (Cb) and increase the capacitance. However, it is difficult to increase the net die due to the structural limitation of the memory cell.

Recently, three-dimensional semiconductor memory devices including three-dimensionally arranged memory cells have been proposed.

SUMMARY

Embodiments of the present invention provide a semiconductor device having a highly integrated memory cell and a method of fabricating the same.

According to an embodiment of the present invention, a semiconductor device comprises: a lower structure; a plurality of semiconductor layers laterally oriented in a direction parallel to a surface of the lower structure; a plurality of bit lines connected an end of the semiconductor layers and extending in a direction perpendicular to the surface of the lower structure; word lines extending laterally in a direction crossing the semiconductor layers over the semiconductor layers; and a device isolation layer extending in the direction parallel to the surface of the lower structure to be disposed between the bit lines and the word lines and including air gaps.

According to an embodiment of the present invention, a semiconductor device comprises: a lower structure; a plurality of active layers extending in a direction parallel to a surface of the lower structure; word lines extending laterally in a direction crossing the active layers over the active layers; a plurality of bit lines connected to an end of the active layers and extending in a direction perpendicular to the surface of the lower structure; a plurality of capacitors connected to an opposite end of the active layers; and a device isolation layer including air gaps, the air gaps being disposed between the bit lines and the word lines.

According to an embodiment of the present invention, a method of fabricating a semiconductor device comprises: forming a stack body including a plurality of sacrificial layers over an upper portion of a lower structure; forming a plurality of device isolation layers in the stack body; forming vertical openings between the device isolation layers by etching the stack body; forming vertical conductive lines in the vertical openings, respectively; etching portions of the device isolation layers to form an air gap in each of the device isolation layers; and forming an air gap capping layer covering an upper portion of the air gaps.

According to an embodiment of the present invention, a method of fabricating a semiconductor device comprises: forming a bit line pad over an upper portion of a lower structure; forming a stack body alternately stacked in the order of a cell isolation layer, a first sacrificial layer, a semiconductor layer, and a second isolation layer over an upper portion of the bit line pad; forming a plurality of vertical device isolation layers in the stack body; replacing portions of the first and second sacrificial layers of the stack body with horizontal word lines; forming vertical openings between the vertical device isolation layer by etching the stack body to expose the bit line pad; forming a vertical bit line in each of the vertical openings; etching portions of the device isolation layers to form a vertical air gap in each of the vertical device isolation layers; and forming an air gap capping layer covering an upper portion of the vertical air gap.

Since the present invention forms an air gap between word lines and bit lines, t is possible to reduce parasitic capacitance.

DETAILED DESCRIPTION

Figure 1:
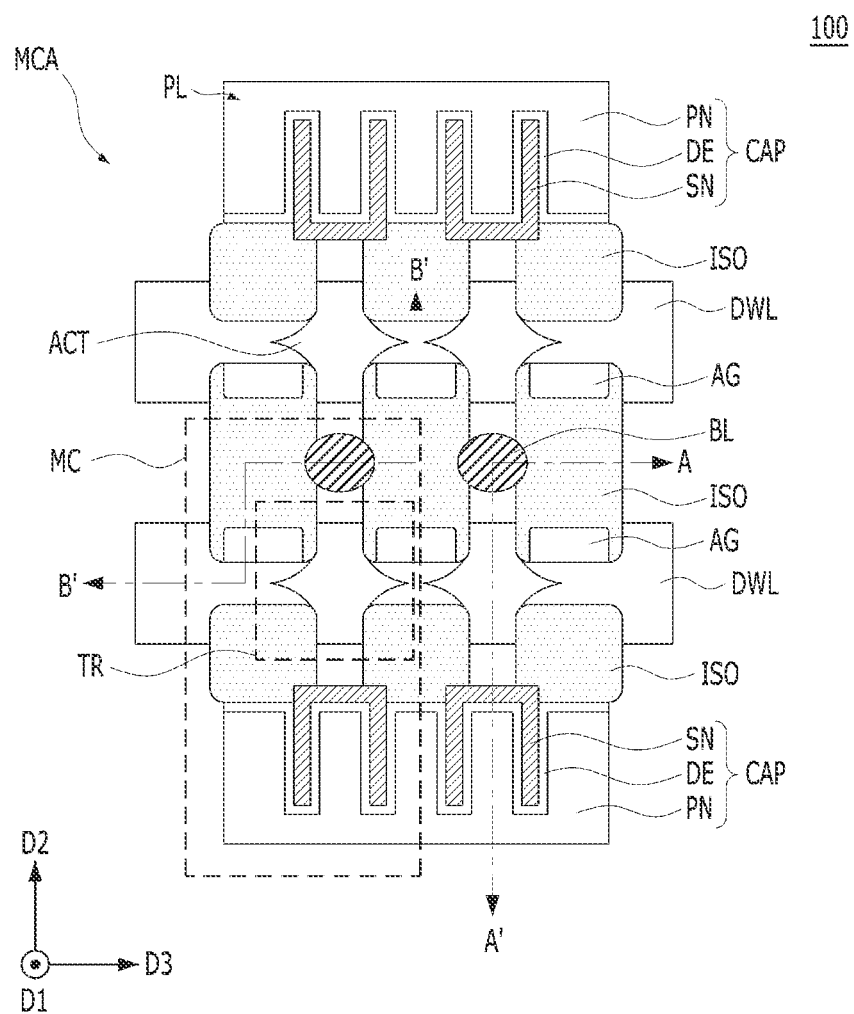
FIG. 1 is a schematic plan view of a semiconductor device according to an embodiment.

Various embodiments described herein will be described with reference to cross-sectional views, plan views and block diagrams, which are ideal schematic views of the present invention. Therefore, the structures of the drawings may be modified due to fabricating technology and/or tolerances. Accordingly, various embodiments of the present invention are not limited to the specific structures shown in the drawings, but include any changes in the structures that may be produced according to the fabricating process. Therefore, any regions and shapes of regions illustrated in the drawings have schematic views, are intended to illustrate specific examples of structures of regions of the various elements, and are not intended to limit the scope of the invention.

An embodiment to be described below may vertically stack memory cells to increase memory cell density and reduce parasitic capacitance.

Figure 2A:
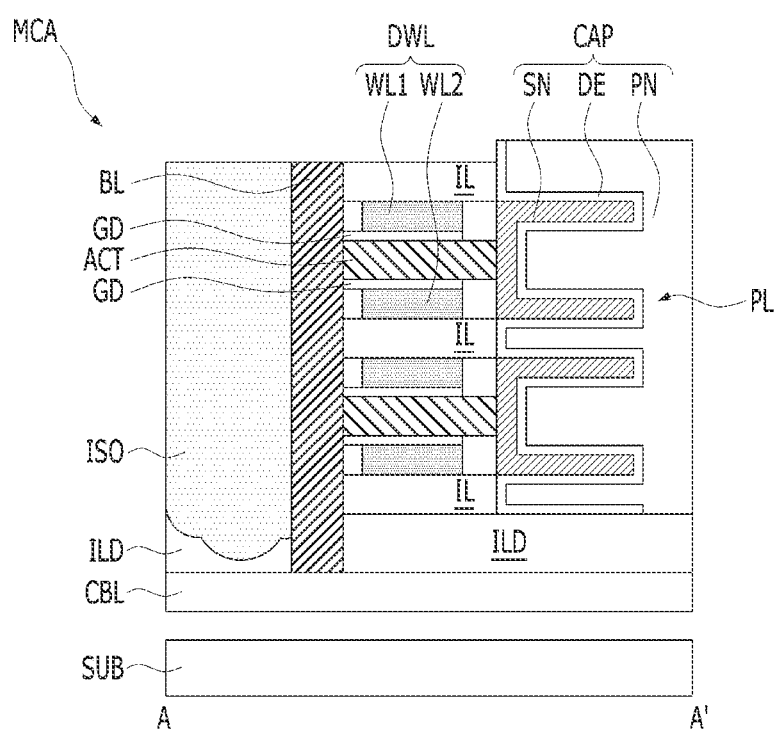
FIG. 2A is a cross-sectional view taken along line A-A' of FIG. 1.
Figure 2B:
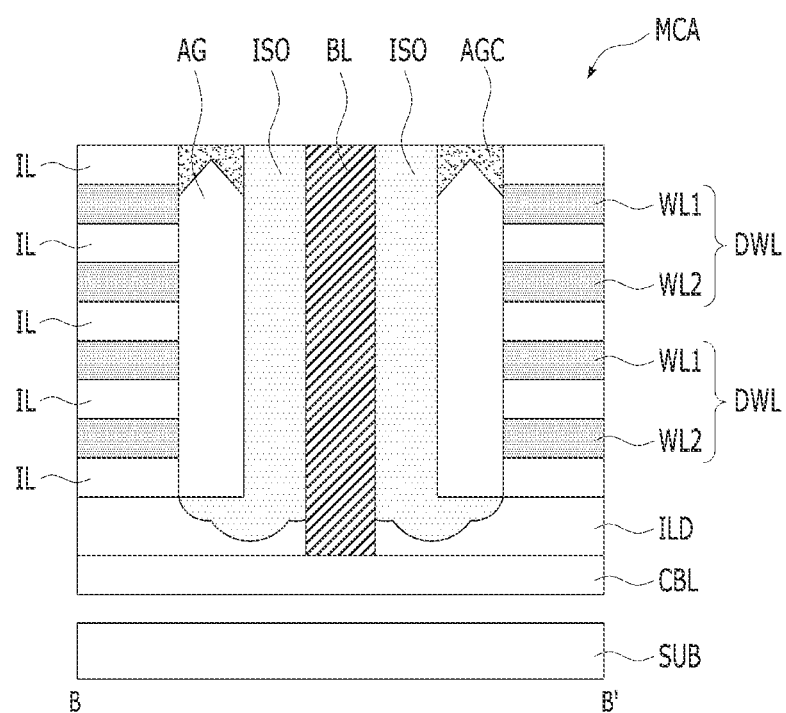
FIG. 2B is a cross-sectional view taken along line B-B' of FIG. 1.

FIG. 1 is a schematic plan view of a semiconductor device according to an embodiment. FIG. 2A is a cross-sectional view taken along line A-A' of FIG. 1. FIG. 2B is a cross-sectional view taken along line B-B' of FIG. 1.

Referring to FIGS. 1 to 2B, the semiconductor device 100 may include a lower structure SUB and a memory cell array MCA. The memory cell array MCA may be disposed on the lower structure SUB.

The memory cell array MCA may include a plurality of memory cells MC. The memory cell array MCA may have a mirror type structure that shares a bit line BL. Each memory cell MC may include a bit line BL, a transistor TR, and a capacitor CAP. The individual transistor TR may include an active layer ACT and a double word line DWL, and the double word line DWL may include first and second word lines WL1 and WL2 facing each other with the active layer ACT interposed therebetween. The individual capacitor CAP may include a storage node SN, a dielectric layer DE, and a plate node PN.

The bit line BL may have a pillar shape extending in the first direction D1. The active layer ACT may have a bar shape extending in the second direction D2 intersecting the first direction D1. The double word line DWL may have a line shape extending in the third direction D3 crossing the first and second directions D1 and D2. The plate nodes PN of the capacitors CAP may be interconnected.

The bit line BL may be vertically oriented along the first direction D1. The bit line BL may be referred to as a vertically oriented bit line or a pillar-shaped bit line. The bit line BL may include a conductive material. The bit line BL may include a silicon-based material, a metal-based material, or a combination thereof. The bit line BL may include silicon, metal, metal nitride, metal silicide, or a combination thereof. The bit line BL may include polysilicon, titanium nitride, tungsten, or a combination thereof. For example, the bit line BL may include polysilicon or titanium nitride (TiN) doped with N-type impurities. The bit line BL may include a TiN/W stack including titanium nitride and tungsten formed on the titanium nitride, The double word line DWL may extend in the third direction D3, and the active layer ACT may extend in the second direction D2. The active layer ACT may be laterally arranged along the second direction D2 from the bit line BL. The double word line DWL may include a pair of word lines, that is, a first word line WL1 and a second word line WL2. The first word line WL1 and the second word line WL2 may face each other in the first direction D1 with the active layer ACT interposed therebetween. A gate insulating layer GD may be formed on the upper and lower surfaces of the active layer ACT.

The transistor TR is a cell transistor and may have a double word line DWL. In the double word line DWL, the first word line WL1 and the second word line WL2 may have the same potential. For example, the first word line WL1 and the second word line WL2 may form a pair, and the same word line driving voltage may be applied to the first word line WL1 and the second word line WL2. As such, the memory cell MC according to the present embodiment may have a double word line DWL in which a pair of the first and second word lines WL1 and WL2 are adjacent to one active layer ACT.

In another embodiment, the first word line WL1 and the second word line WL2 may have different potentials. For example, a word line driving voltage may be applied to the first word line WL1, and a ground voltage may be applied to the second word line WL2. The second word line WL2 may be referred to as a back word line or a shield word line, In another embodiment, a ground voltage may be applied to the first word line WL1, and a word line driving voltage may be applied to the second word line WL2.

The active layer ACT may include a semiconductor material or an oxide semiconductor material. For example, the active layer ACT may include silicon, germanium, silicon-germanium, or indium gallium zinc oxide (IGZO). The active layer ACT may include polysilicon or single crystal silicon.

The active layer ACT may have a thickness smaller than that of the first and second word lines WL1 and WL2. In other words, a vertical thickness of the active layer ACT in the first direction D1 may be smaller than a vertical thickness of each of the first and second word lines WL1 and WL2 in the first direction D1. As such, the thin active layer ACT may be referred to as a thin-body active layer.

The gate insulating layer GD may be formed of silicon oxide, silicon nitride, metal oxide, metal oxynitride, metal silicate, high-k material, ferroelectric material, antiferroelectric material, or a combination thereof. The gate insulating layer GD may include $SiO_2$, $Si_3N_4$, $HfO_2$, $Al_2O_3$, $ZrO_2$, AlON, HfON, HfSiO, HfSiON, or HfZrO, The double word line DWL may include a metal, a metal mixture, a metal alloy, or a semiconductor material. The double word line DWL may include titanium nitride, tungsten, polysilicon, or a combination thereof. For example, the double word line DWL may include a TiN/W stack in which titanium nitride and tungsten are sequentially stacked. The double word line DWL may include an N-type workfunction material or a P-type workfunction material. The N-type workfunction material may have a low workfunction of 4.5 eV or less, and the P-type workfunction material may have a high workfunction of 4.5 eV or more.

The capacitor CAP may be laterally disposed along the second direction D2 from the transistor TR. The capacitor CAP may include the storage node SN laterally extending from the active layer ACT in the second direction D2. The capacitor CAP may further include a dielectric layer DE and a plate node PN on the storage node SN. The storage node SN, the dielectric layer DE, and the plate node PN may be laterally arranged in the second direction D2. The storage node SN may have a laterally oriented cylinder-shape. The dielectric layer DE may conformally cover the cylinder inner wall and the cylinder outer wall of the storage node SN. The plate node PN may have a shape extending to the cylinder inner wall and the cylinder outer wall of the storage node SN which is disposed on the dielectric layer DE. The plate node PN may be connected to the plate line PL. The storage node SN may be electrically connected to the active layer ACT.

The storage node SN has a three-dimensional structure, and the storage node SN of the three-dimensional structure may have a lateral three-dimensional structure oriented along the second direction D2. As an example of the three-dimensional structure, the storage node SN may have a cylinder shape. In another embodiment, the storage node SN may have a pillar shape or a pylinder shape. The pylinder shape may refer to a structure in which a pillar shape and a cylinder shape are merged.

The storage node SN and the plate node PN may include a metal, a noble metal, a metal nitride, a conductive metal oxide, a conductive noble metal oxide, a metal carbide, a metal silicide, or a combination thereof, For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, and a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the inside of the cylinder of the storage node SN on the titanium nitride, titanium nitride (TIN) may be a plate node PN, and tungsten nitride may be a low-resistance material.

The dielectric layer DE may include silicon oxide, silicon nitride, a high-k material, or a combination thereof. The high-k material may have a higher dielectric constant than silicon oxide does. Silicon oxide ($SiO_2$) may have a dielectric constant of about 3.9, and the dielectric layer DE may include a high-k material having a dielectric constant of 4 or more. The high-k material may have a dielectric constant of about 20 or more. The high-k materials may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). In another embodiment, the dielectric layer DE may be formed of a composite layer including two or more layers of the aforementioned high-k material.

The dielectric layer DE may be formed of zirconium-based oxide. The dielectric layer DE may have a stack structure including at least zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide-based layer ($ZrO_2$-based layer). In another embodiment, the dielectric layer DE may be formed of hafnium-based oxide (Hf-based oxide). The dielectric layer DE may have a stack structure including at least hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide-based layer ($HfO_2$-based layer). In the ZA stack, ZAZ stack, HA stack, and HAH stack, aluminum oxide ($Al_2O_3$) may have higher band gap energy (hereinafter abbreviated as bandgap) than zirconium oxide ($ZrO_2$) and hafnium oxide ($HfO_2$), Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a bandgap greater than that of the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. In another embodiment, the dielectric layer DE may include a laminated structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack or a HAHAH ($HfO_2/Al_2O_3/HfO_2/Al_2O_3/HfO_2$) stack. In the above laminated structure, the aluminum oxide ($Al_2O_3$) layer may be thinner than the zirconium oxide ($ZrO_2$) layer and the hafnium oxide ($HfO_2$) layer.

In another embodiment, the dielectric layer DE may include a stack structure, a laminated structure, or a mutual mixing structure including zirconium oxide, hafnium oxide, and aluminum oxide.

In another embodiment, the dielectric layer DE may include a ferroelectric material or an antiferroelectric material.

In another embodiment, an interface control layer for improving leakage current may be further formed between the storage node SN and the dielectric layer DE. The interface control layer may include titanium oxide ($TiO_2$), niobium oxide, or niobium nitride. The interface control layer may also be formed between the plate node PN and the dielectric layer DE, The capacitor CAP may include a metal-insulator-metal (MIM) capacitor. The storage node SN and the plate node PN may include a metal-based material.

The capacitor CAP may be replaced with a different data element. For example, the data element may include a phase change element, a magnetic tunnel junction (MTJ), or a variable resistance element.

The memory cells MC may be arranged in the first to third directions D1, D2, and D3 to form the memory cell array MCA. The memory cell array MCA may include a three-dimensional array of memory cells MC.

Active layers ACT adjacent to each other in the first direction D1 may contact one bit line BL. Active layers ACT adjacent to each other along the third direction D3 may share the double word line DWL. The capacitors CAP may be connected to each of the active layers ACT. The capacitors CAP may share one plate line PL. The individual active layers ACT may be thinner than the first and second word lines WL1 and WL2 of the double word line DWL.

In the memory cell array MCA, a plurality of double word lines DWL may be vertically stacked in the first direction D1. The individual double word line DWL may include a pair of a first word line WL1 and a second word line WL2. Between the first word line WL1 and the second word line WL2, a plurality of active layers ACT may be spaced apart from each other in the third direction D3 and arranged laterally. A channel of the active layer ACT may be disposed between the first word line WL1 and the second word line WL2.

A cell isolation layer IL may be formed between the memory cells MC which are stacked in the first direction D1. The cell isolation layer IL may include silicon oxide.

The bit lines BL may be electrically connected to the bit line pad CBL. An interlayer dielectric layer ILD may be formed between the memory cell MC at the lowest level and the bit line pad CBL. The interlayer dielectric layer ILD may include an insulating material.

A device isolation layer ISO may be formed between the bit lines BL and the double word lines DWL. The device isolation layer ISO may include air gaps AG, and upper portions of the air gaps AG may be covered by air gap capping layers AGC. The air gaps AG may directly contact the double word lines DWL and may be spaced apart from the bit lines BL. The device isolation layer ISO may be disposed between the double word lines DWL adjacent in the second direction D2, and the air gaps AG may directly contact the double word lines DWL. The air gaps AG may extend vertically along the first direction D1 and may be located in the device isolation layers ISO.

The device isolation layer ISO may include silicon oxide, silicon carbon oxide, silicon nitride, or a combination thereof.

In other embodiments, the lower structure SUB may include peripheral circuits. The peripheral circuits may include a plurality of peripheral circuit transistors. The peripheral circuits may be located at a lower level than the memory cell array MCA. This may be referred to as a COP (Cell over PERI) structure. The peripheral circuits may include at least one control circuit for driving the memory cell array MCA. The at least one control circuit of the peripheral circuits may include an N-channel transistor, a P-channel transistor, a CMOS circuit, or a combination thereof. At least one control circuit of the peripheral circuit unit PERI may include an address decoder circuit, a read circuit, a write circuit, and the like. At least one control circuit of the peripheral circuits may include a planar channel transistor, a recess channel transistor, a buried gate transistor, a fin channel transistor (FinFET), and the like.

For example, the peripheral circuits may include sub word line drivers and a sense amplifier. The double word line DWL may be connected to the sub word line driver. The bit lines BL may be connected to the sense amplifier.

FIGS. 3 to 17 are diagrams illustrating a method of fabricating a semiconductor device according to an embodiment of the present invention. FIGS. 3 to 17 illustrate a fabricating method according to A-A' and B-B' of FIG. 1.

Figure 3:
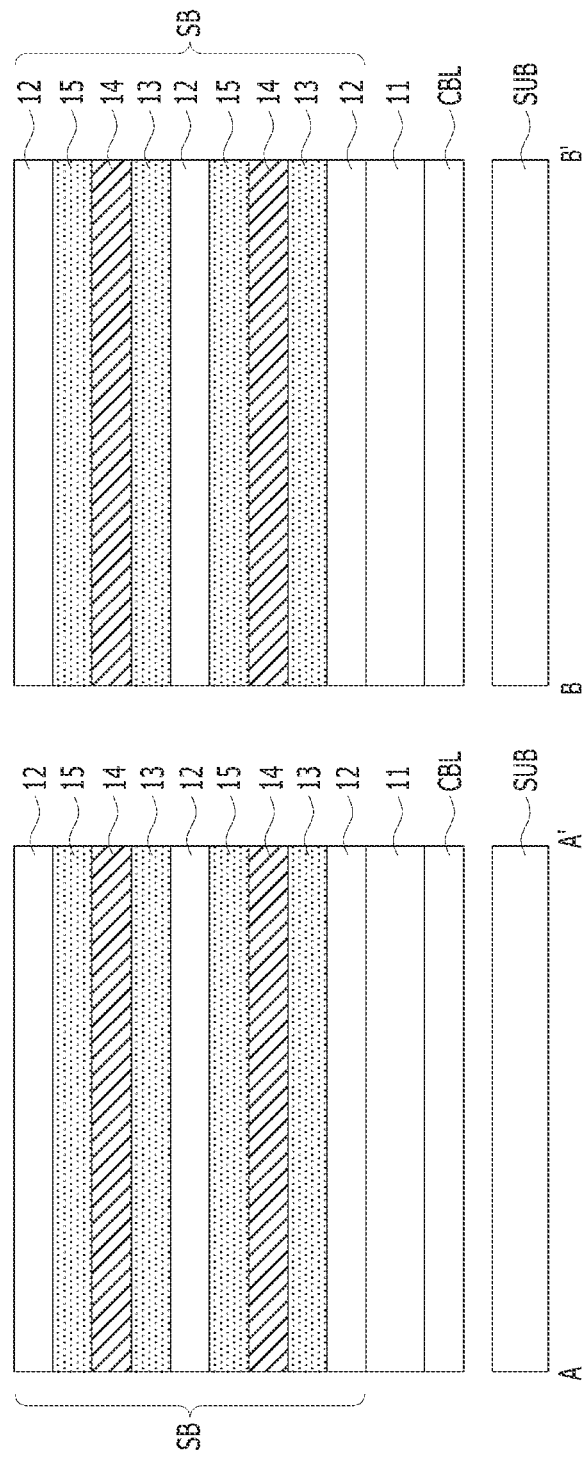
FIGS. 3 to 17 are diagrams illustrating a method of fabricating a semiconductor device according to an embodiment of the present invention.

As shown in FIG. 3, a bit line pad CBL may be formed on the lower structure SUB. The bit line pad CBL may include a metal-based material. The bit line pad CBL may include tungsten, titanium nitride, or a combination thereof. The lower structure SUB may include a semiconductor substrate. The bit line pad CBL may be spaced apart from the lower structure SUB, insulating materials may be disposed between the bit line pad CBL and the lower structure SUB.

An interlayer dielectric layer 11 may be formed on the bit line pad CBL. The interlayer dielectric layer 11 may include silicon oxide, silicon carbon oxide, silicon nitride, or a combination thereof. In this embodiment, the interlayer dielectric layer 11 may be silicon oxide.

A stack body SB may be formed on the interlayer dielectric layer 11. In the stack body SB, a plurality of sub-stacks may be alternately stacked. For example, sub-stacks may be alternately stacked in the order of the cell isolation layer 12, the first sacrificial layer 13, the semiconductor layer 14, and the second sacrificial layer 15. In the sub-stacks, the semiconductor layer 14 may be disposed between the cell isolation layers 12, the first sacrificial layer 13 may be disposed between the semiconductor layer 14 and the cell isolation layers 12, and the second sacrificial layer 15 may be disposed between the semiconductor layer 14 and the cell isolation layers 12. The cell isolation layer 12 may be silicon oxide, and the first and second sacrificial layers 13 and 15 may be silicon nitride. The semiconductor layer 14 may include a silicon layer, a monocrystalline silicon layer, or a polysilicon layer. The uppermost layer in the stack body SB may be the cell isolation layer 12.

Figure 4:
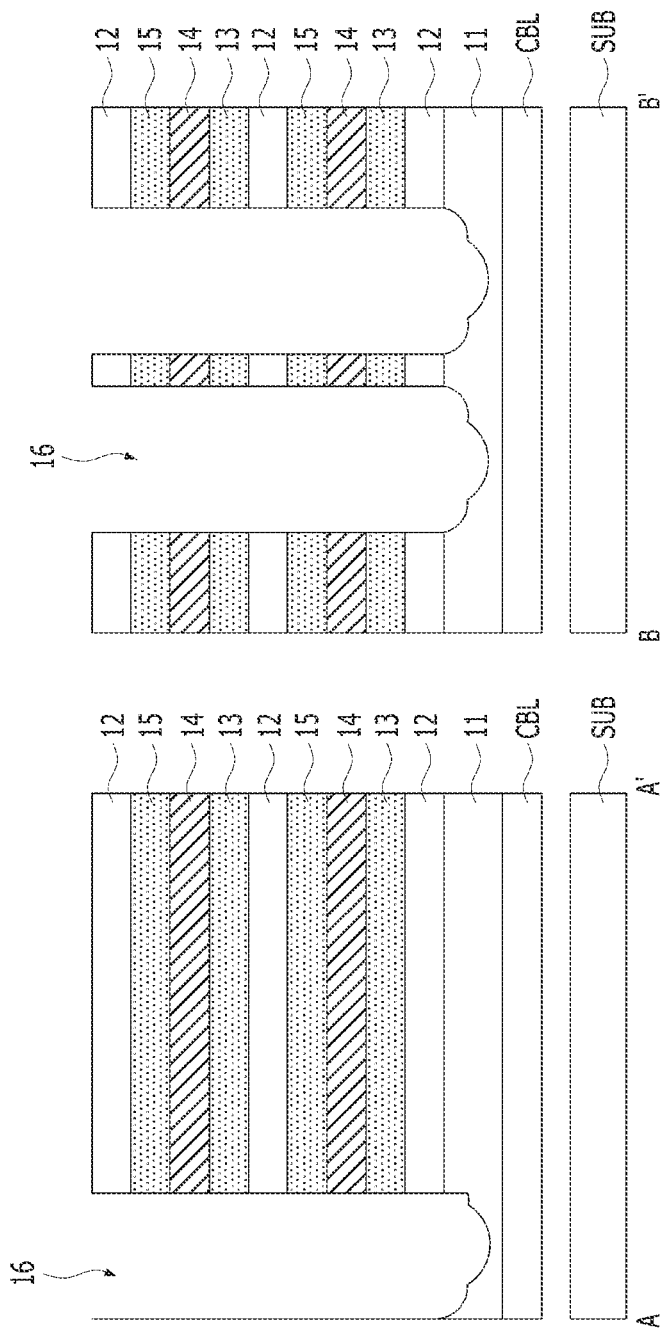
Figure 5:
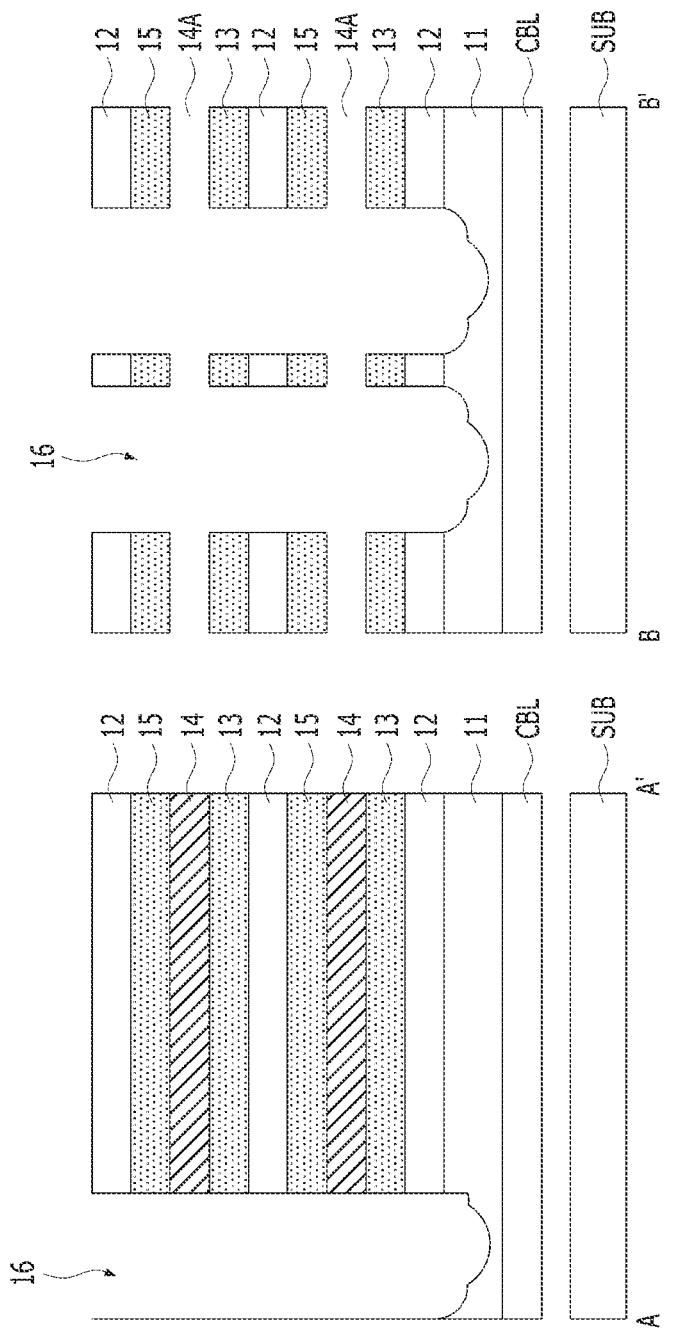

As shown in FIG. 4, first openings 16 passing through a portion of the stack body SB may be formed. The first openings 16 may recess a portion of the interlayer dielectric layer 11. The first openings 16 may include a trench for device isolation, As shown in FIG. 5, portions of the semiconductor layer 14 may be recessed through the first openings 16. Accordingly, lateral recesses 14A may be formed between the first sacrificial layer 13 and the second sacrificial layer 15. The semiconductor layers 14 may remain in the A-A' direction, and lateral recesses 14A may be formed in the B-B' direction.

Figure 6:
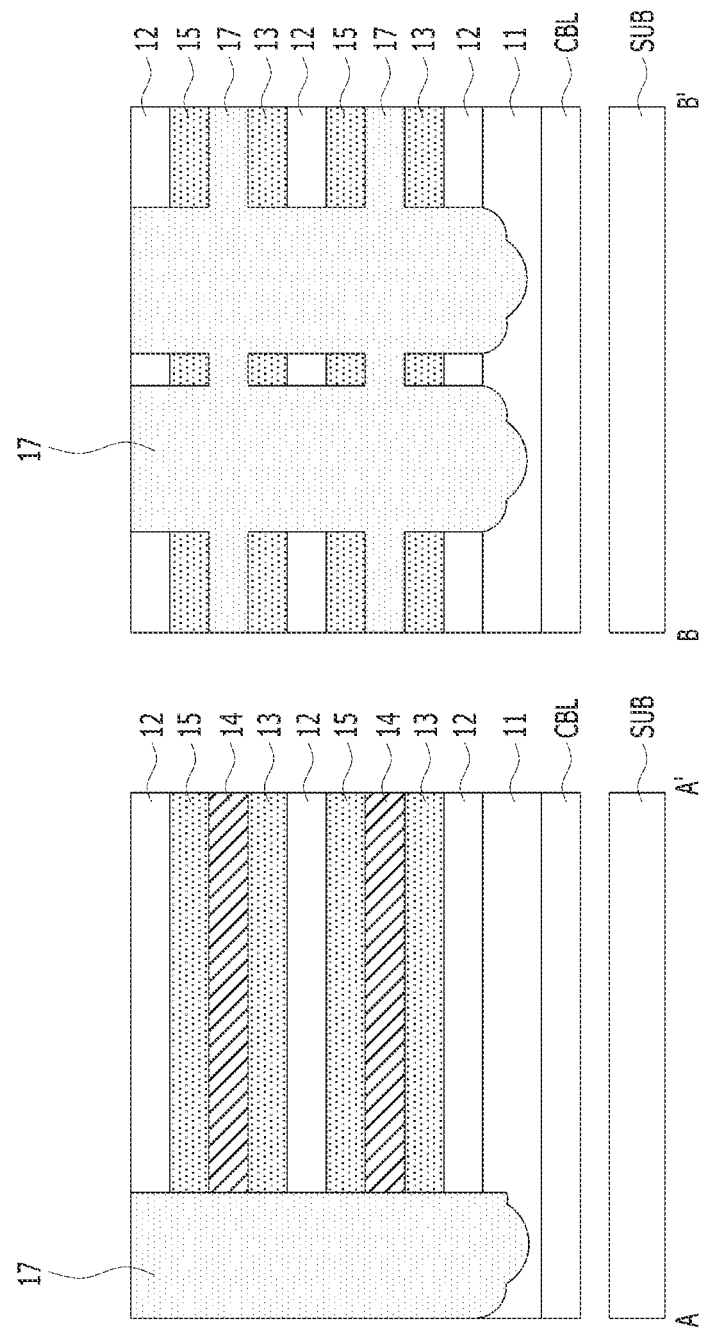

As shown in FIG. 6, a device isolation layer 17 filling the lateral recesses 14A and the first openings 16 may be formed. The device isolation layer 17 may include silicon oxide, silicon carbon oxide, silicon nitride, or a combination thereof. The device isolation layer 17 may include vertically extending portions and laterally extending portions.

Figure 7:
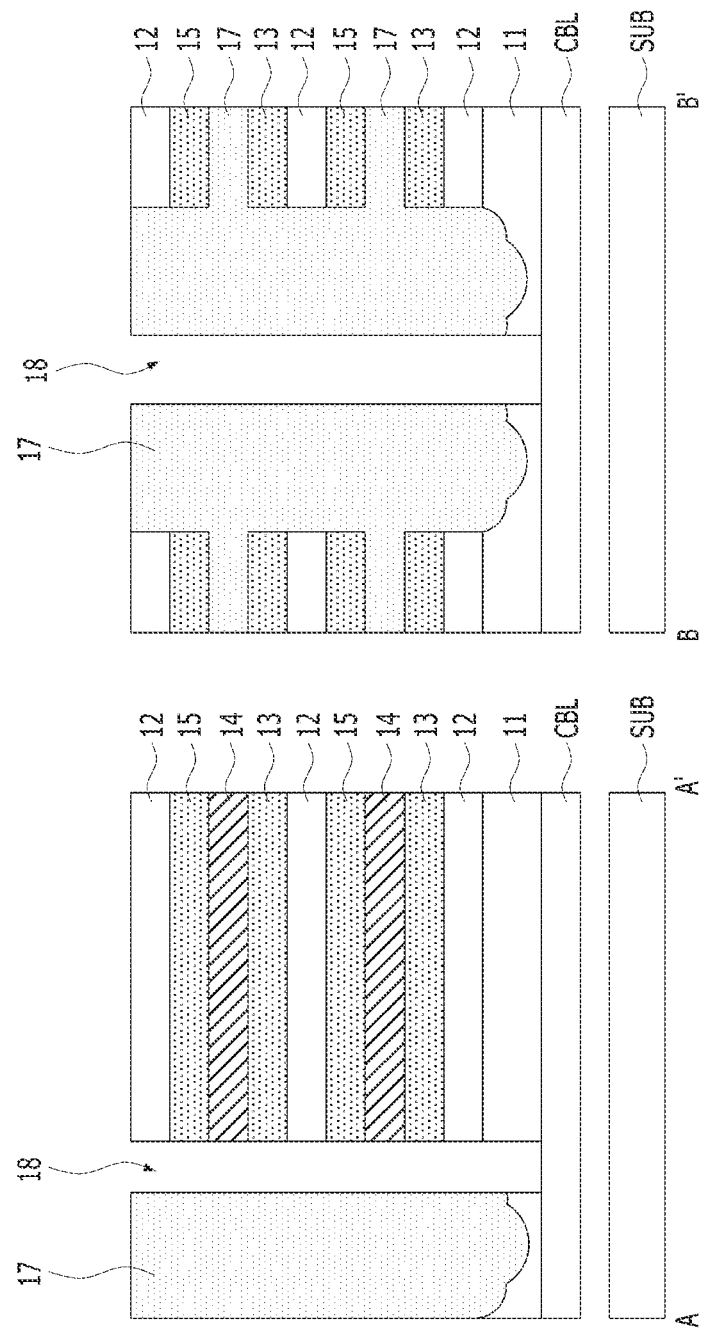

As shown in FIG. 7, a portion of the device isolation layer 17 may be etched to form second openings 18. The second openings 18 may extend vertically to expose a portion of the bit line pad CBL. The second openings 18 may be referred to as vertical openings.

Figure 8:
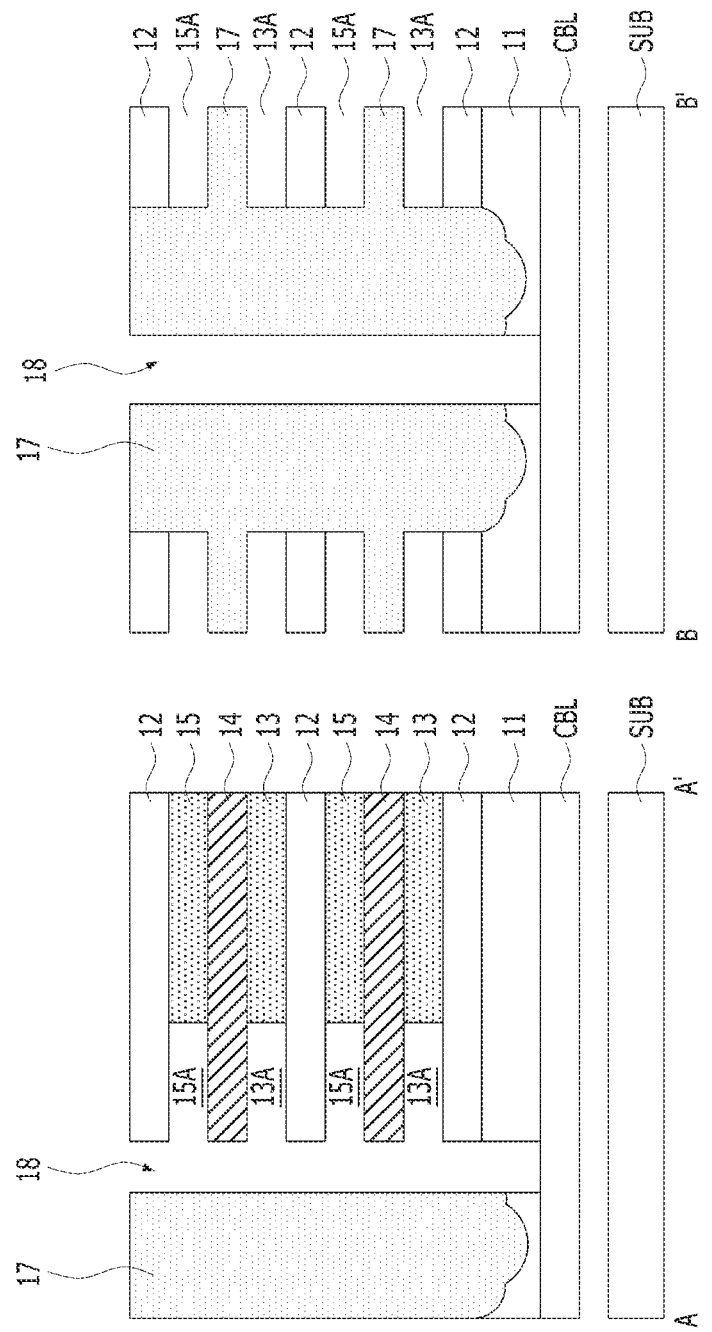

As shown in FIG. 8, the first and second sacrificial layers 13 and 15 may be laterally recessed through the second openings 18. Accordingly, gate recesses 13A and 15A may be formed between the cell isolation layer 12 and the semiconductor layer 14. A portion of the semiconductor layer 14 may be exposed by the gate recesses 13A and 15A. In the B-B' direction, both the first and second sacrificial layers 13 and 15 may be removed to form the gate recesses 13A and 15A.

Figure 9:
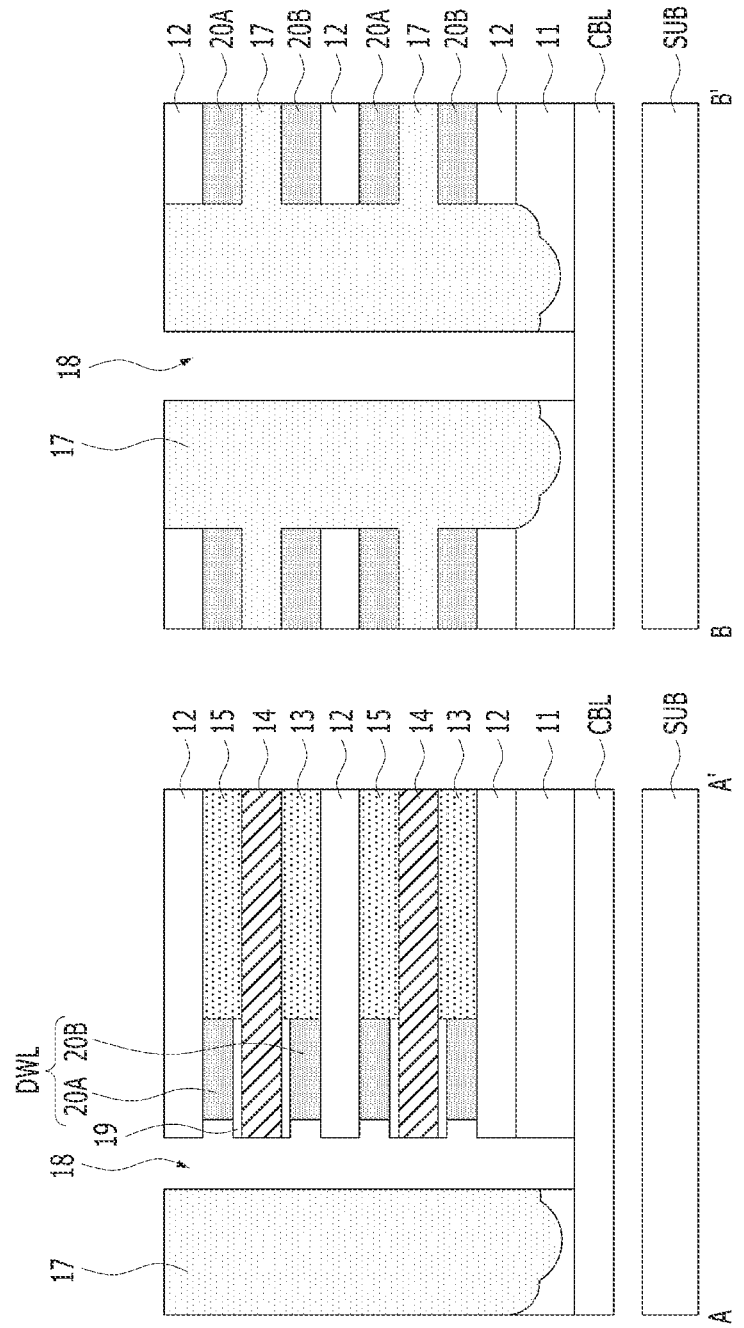

As shown in FIG. 9, a gate insulating layer 19 may be formed on the exposed semiconductor layers 14. The gate insulating layer 19 may be formed by an oxidation process or a deposition process. The gate insulating layer 19 may include silicon oxide, silicon nitride, a high-k layer, or a combination thereof.

Next, lateral conductive lines, i.e., a first word line 20A and a second word line 20B, filling the gate recesses 13A and 15A, may be formed on the gate insulating layer 19. The first and second word lines 20A and 20B may constitute a double word line DWL. In the B-B' direction, the device isolation layer 17 may be disposed between the first word line 20A and the second word line 20B. In the A-A' direction, the semiconductor layer 14 and the gate insulating layer 19 may be disposed between the first word line 20A and the second word line 20B.

Referring to FIGS. 7 to 9, a portion of the first and second sacrificial layers 13 and 15 may be replaced with the first and second word lines 20A and 20B.

Figure 10:
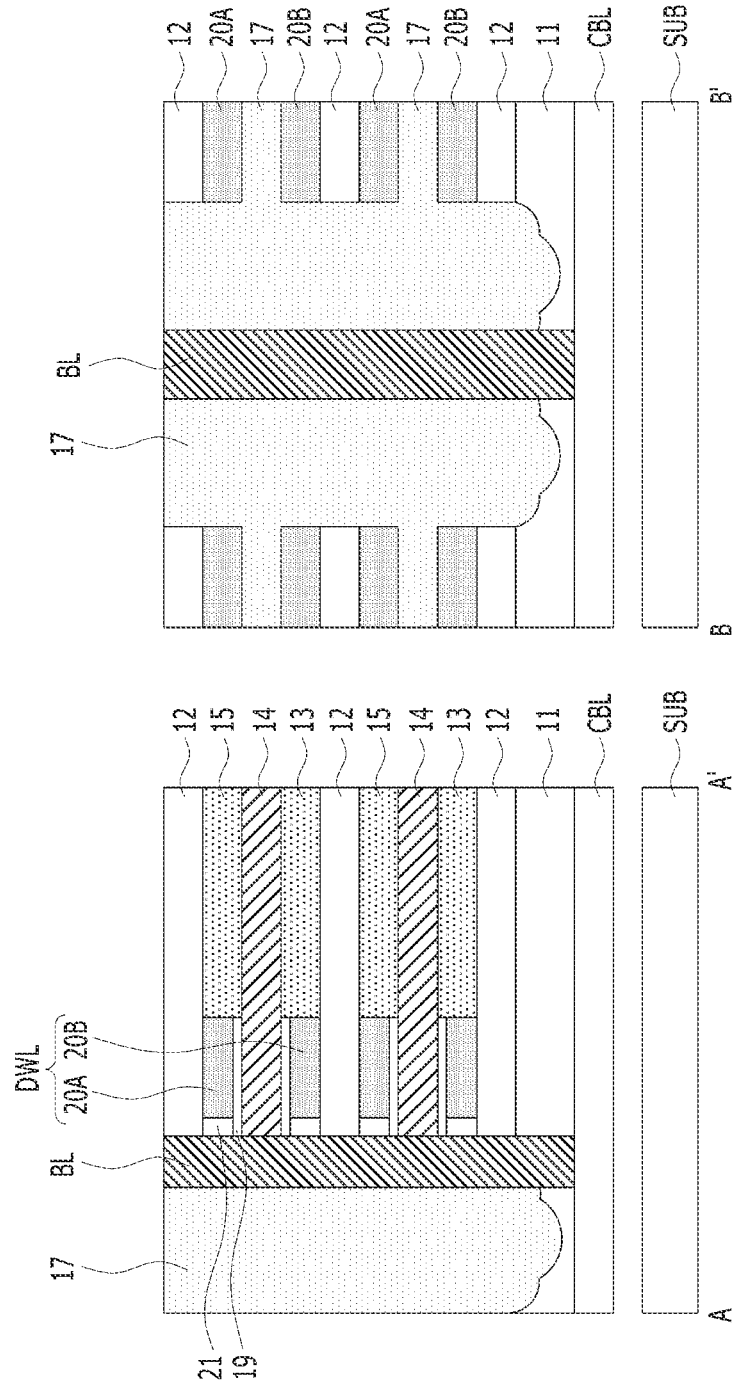

As shown in FIG. 10, a vertical conductive line, that is a bit line BL, filling the second openings 18 may be formed. The bit line BL may be connected to the bit line pad CBL and may extend vertically. The bit line BL may include a metal-based material. The bit line BL may include tungsten, titanium nitride, or a combination thereof. Before forming the bit line BL, a bit line side capping layer 21 may be formed on one side of the double word line DWL. The bit line side capping layer 21 may include an insulating material.

Figure 11:
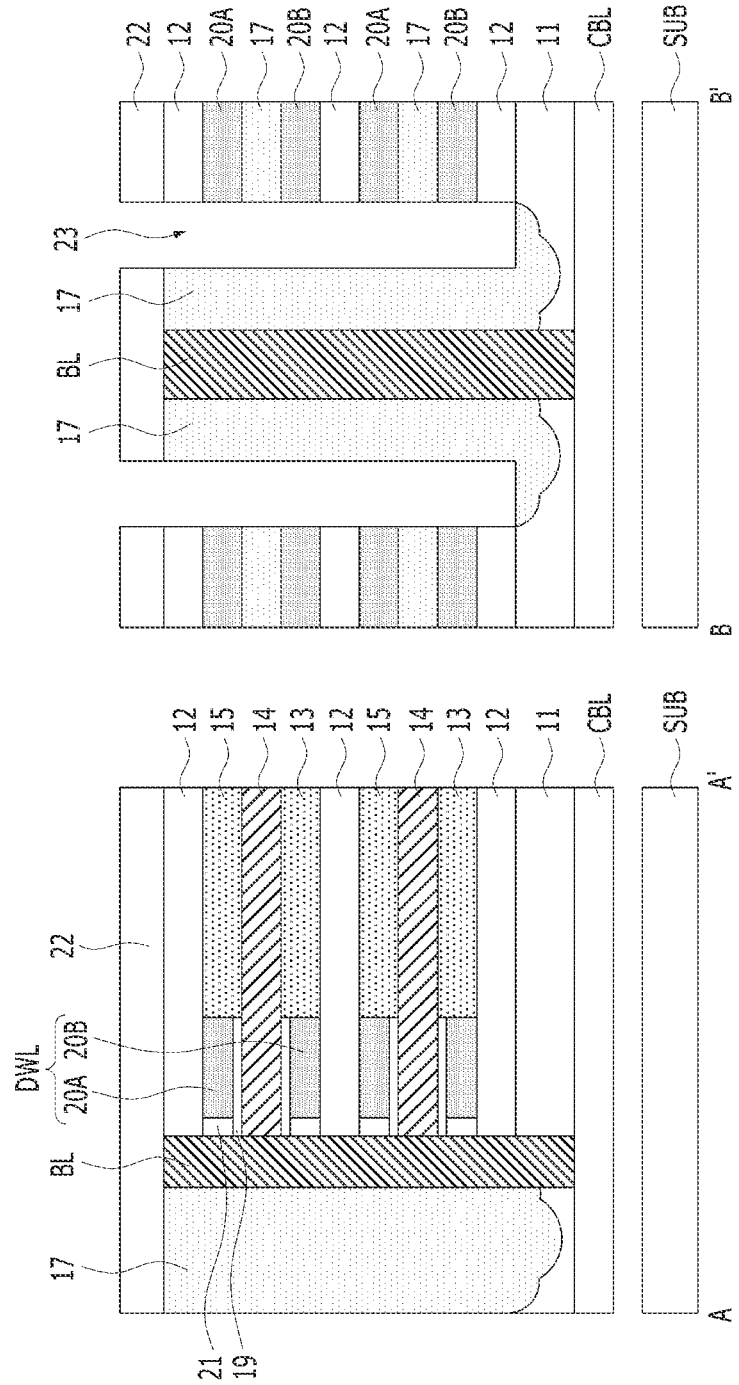

As shown in FIG. 11, a portion of the device isolation layer 17 may be etched by using the mask layer 22 to form third openings 23. In the B-B' direction, the third openings 23 may expose one sidewall of the first and second word lines 20A and 20B. The third openings 23 may be disposed between the bit line BL and the first and second word lines 20A and 20B, and may extend vertically from the interlayer dielectric layer 11.

Figure 12:
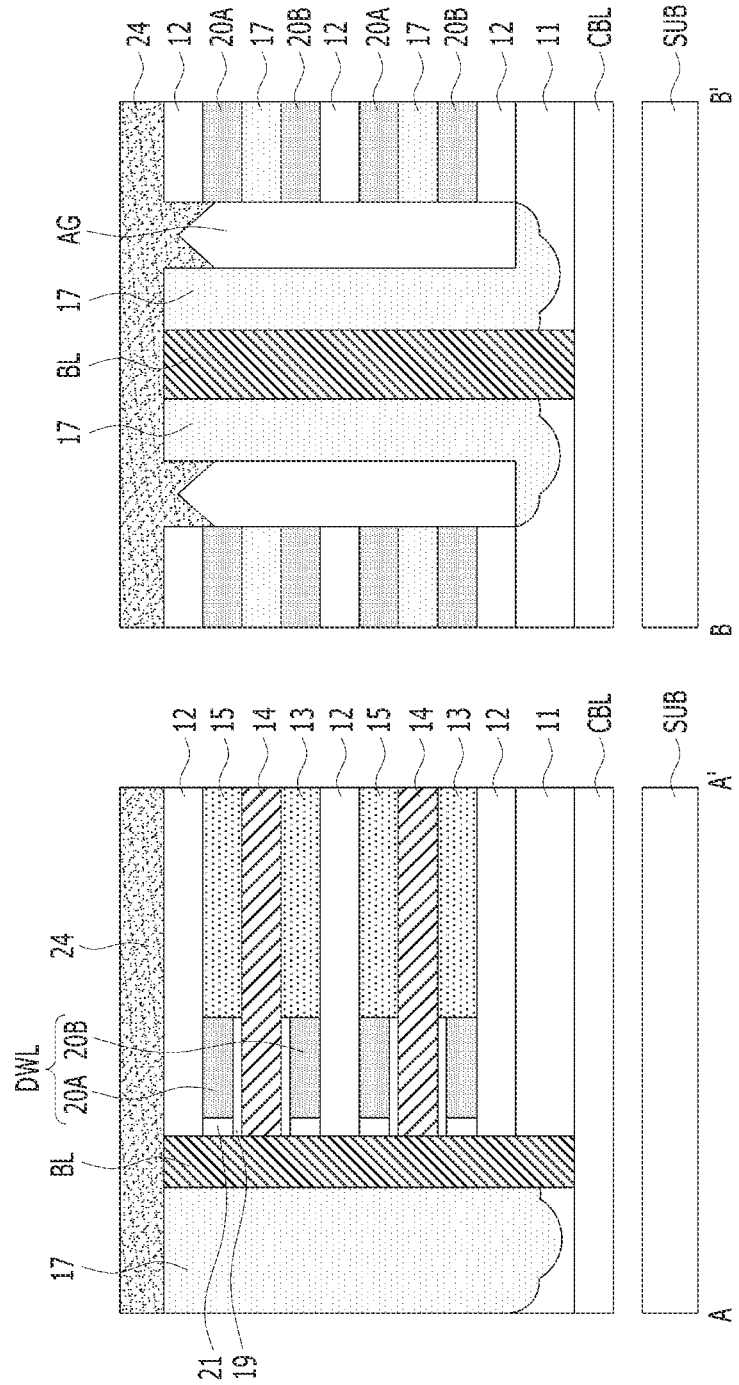

As shown in FIG. 12, after removing the mask layer 22, an air gap capping layer 24 covering upper portions of the third openings 23 may be formed. The air gap capping layer 24 may include silicon oxide. The air gap capping layer 24 may be deposited by plasma enhanced chemical vapor deposition (PECVD), thereby sealing upper portions of the third openings 23.

As the air gap capping layer 24 is formed, air gaps AG may be defined between the bit line BL and the first and second word lines 20A and 20B. The air gaps AG may extend vertically. The air gaps AG may be referred to as 'vertical air gaps'. The air gaps AG may expose one sidewall of the first and second word lines 20A and 20B. The air gaps AG may be disposed between the bit line BL and the first and second word lines 20A and 20B, and may extend vertically from the interlayer dielectric layer 11. A device isolation layer 17 may be disposed between the air gaps AG and the bit line BL.

Figure 13:
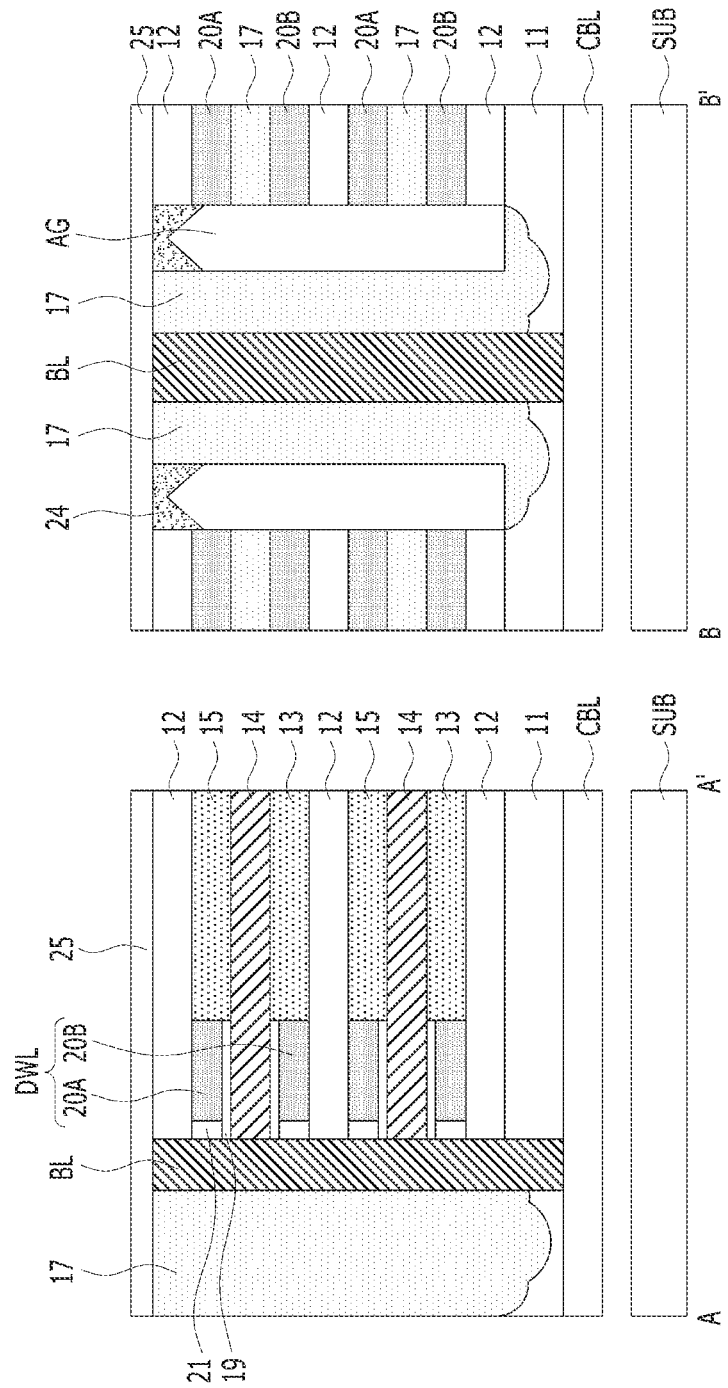

As shown in FIG. 13, the air gap capping layer 24 may be recessed. Accordingly, the air gap capping layer 24 may be disposed at the same level as the surface of the uppermost cell isolation layer 12, and the air gaps AG may not be exposed.

An uppermost capping layer 25 may be formed on the air gap capping layer 24. The uppermost capping layer 25 may include silicon nitride.

Figure 14:
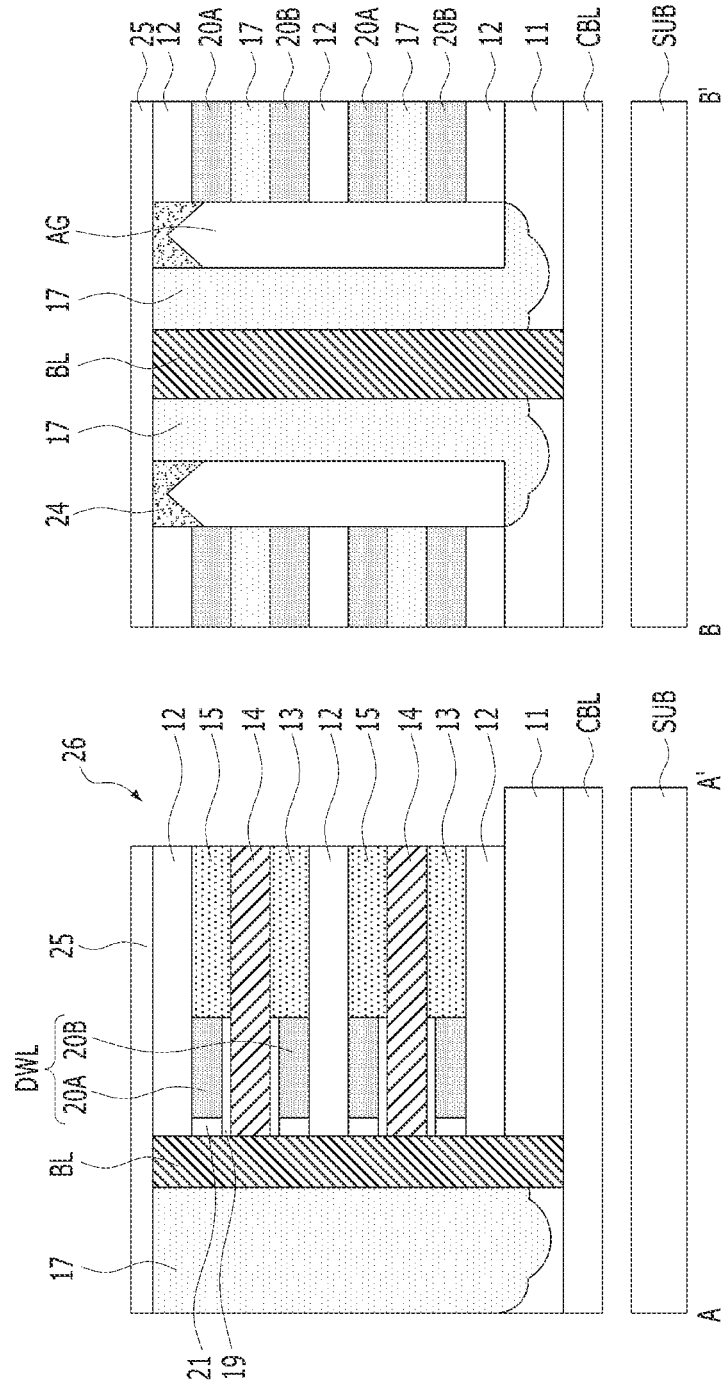

As shown in FIG. 14, the fourth opening 26 may be formed by etching the cell isolation layers 12, the first sacrificial layers 13, the semiconductor layers 14 and the second sacrificial layers 15. Etching of the fourth opening 26 may be stopped at the interlayer dielectric layer 11.

Figure 15:
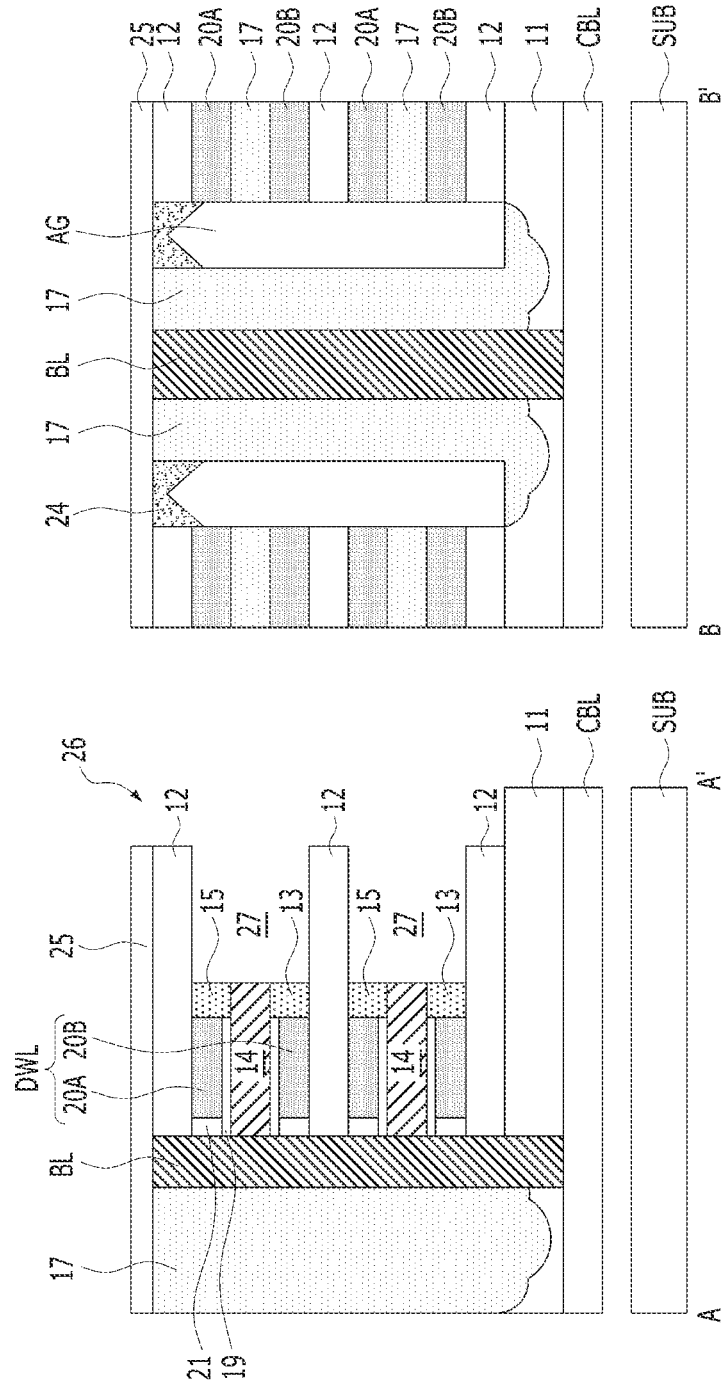

As shown in FIG. 15, the first sacrificial layers 13, the semiconductor layers 14, and the second sacrificial layers 15 may be selectively recessed. Accordingly, a capacitor opening 27 may be formed between the cell isolation layers 12. Capacitor-side capping layers 13 and 15 may remain on one sidewall of the first and second word lines 20A and 20B, respectively. The capacitor-side capping layers 13 and 15 may be formed by recesses of the first and second sacrificial layers 13 and 15.

Figure 16:
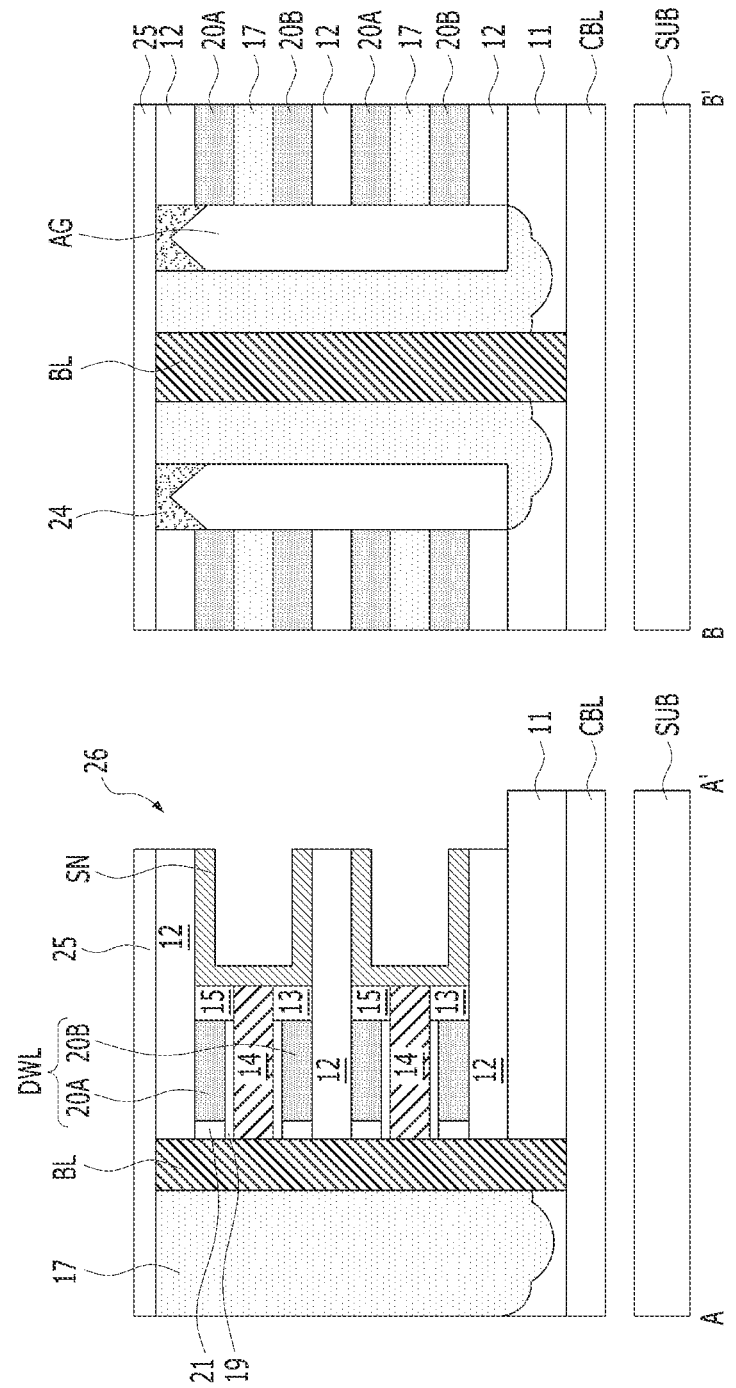

As shown in FIG. 16, a cylindrical storage node SN may be formed in the capacitor opening 27.

Figure 17:
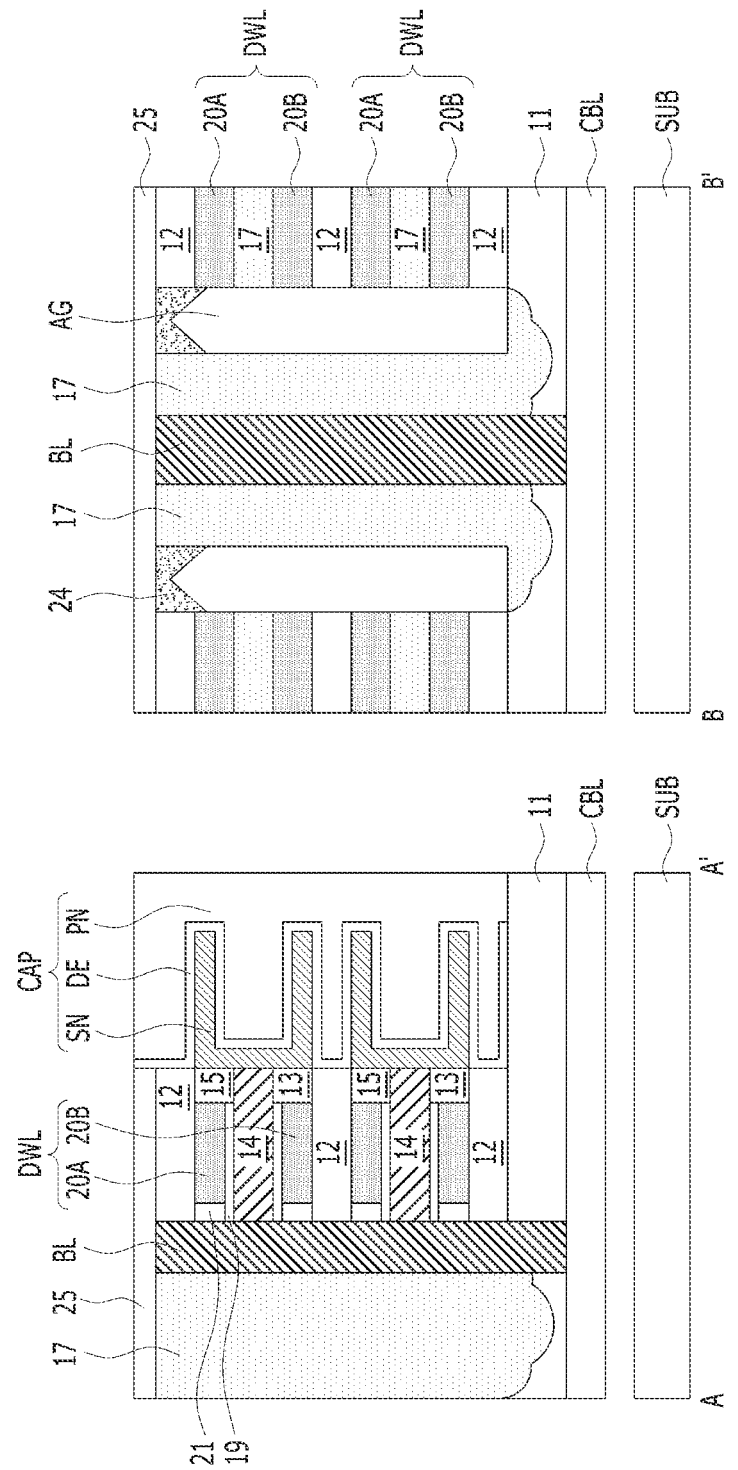

As shown in FIG. 17, after recessing the cell isolation layers 12 and the uppermost capping layer 25, the dielectric layer DE and the plate node PN may be sequentially formed on the storage node SN. The storage node SN, the dielectric layer DE, and the plate node PN may constitute the capacitor CAP.

According to FIGS. 3 to 17 as described above, the method of fabricating a semiconductor device may include forming a stack body SB including a plurality of sacrificial layers 13 and 15 on a lower structure SUB, forming a plurality of device isolation layers 17 in the stack body SB, etching the stack body SB to form vertical openings 18 between the device isolation layers 17, forming the vertical conductive line BL in each of the vertical openings 18, etching portions of the device isolation layers 17 to form the air gap AG in each of the device isolation layers 17, and forming the air gap capping layer 24 covering the upper portion of the air gaps AG.

Referring to FIGS. 3 to 17 as described above, the method of fabricating a semiconductor device includes forming the bit line pad CBL on the lower structure SUB, forming the stack body SB alternately stacked in the order of the cell isolation layer 12, the first sacrificial layer 13, the semiconductor layer 14, and the second sacrificial layer 15, forming a plurality of the vertical device isolation layers in the stack body SB, replacing portions of the first and second sacrificial layers 13 and 15 of the stack body SB with lateral word lines 20A and 20B, forming the vertical openings 18 between the device isolation layers 17 to expose the bit line pad CBL by etching the stack body SB, forming the vertical bit line BL in each of the vertical openings 18, etching portions of the device isolation layers 17 to form the airgap AG in each of the device isolation layers 17, and forming an air gap capping layer 24 covering the upper portion of the vertical air gaps AG.

The present invention described above is not limited to the above-described embodiments and the accompanying drawings, but it will be apparent to those skilled in the art that various changes and modifications can be made within the scope of the technical spirit of the present invention.

What is claimed is:

1. A semiconductor device comprising:
a lower structure;
a plurality of semiconductor layers laterally oriented in a direction parallel to a surface of the lower structure;
a plurality of bit lines connected to an end of the semiconductor layers and extending in a direction perpendicular to the surface of the lower structure;
word lines extending laterally in a direction crossing the semiconductor layers over the semiconductor layers; and
a device isolation layer extending in the direction parallel to the surface of the lower structure to be disposed between the bit lines and the word lines and including air gaps;
wherein the device isolation layer further includes a capping layer capping an upper portion of the air gaps, wherein the air gaps directly contact a sidewall of the word lines.

2. The semiconductor device of claim 1, wherein the device isolation layer includes silicon oxide, silicon carbon oxide, silicon nitride, or a combination thereof.

3. A semiconductor device comprising:
a lower structure;
a plurality of active layers extending in a direction parallel to a surface of the lower structure;
word lines extending laterally in a direction crossing the active layers over the active layers;
a plurality of bit lines connected to an end of the active layers and extending in a direction perpendicular to the surface of the lower structure;
a plurality of capacitors connected to an opposite end of the active layers; and
a device isolation layer including air gaps, the air gaps being disposed between the bit lines and the word lines;
wherein the device isolation layer further includes a capping layer capping an upper portion of the air gaps;
wherein the air gaps directly contact a sidewall of the word lines.

4. The semiconductor device of claim 3, wherein the device isolation layer includes silicon oxide, silicon carbon oxide, silicon nitride, or a combination thereof.

5. The semiconductor device of claim 3, wherein the air gaps extend vertically from the lower structure.

6. The semiconductor device of claim 3, wherein each of the word lines includes a double word line.

7. The semiconductor device of claim 3, wherein each of the active layers includes a silicon layer, a monocrystalline silicon layer, a polysilicon layer, or an oxide semiconductor material.

* * * * *